US006456961B1

(12) United States Patent
Patil et al.

(10) Patent No.: US 6,456,961 B1
(45) Date of Patent: Sep. 24, 2002

(54) METHOD AND APPARATUS FOR CREATING TESTABLE CIRCUIT DESIGNS HAVING EMBEDDED CORES

(76) Inventors: Srinivas Patil, 10608 Icarus Ct., Austin, TX (US) 78726; Wu-Tung Cheng, 19030 SW. 35th Pl., Lake Oswego, OR (US) 97034; Paul J. Reuter, 89 Rice Ave., Northboro, MA (US) 01532

( * ) Notice: Subject to any disclaimer, the term of this patent is extended or adjusted under 35 U.S.C. 154(b) by 0 days.

(21) Appl. No.: 09/302,699

(22) Filed: Apr. 30, 1999

(51) Int. Cl.⁷ .......................... G06F 17/50; G06F 11/00
(52) U.S. Cl. ............... 703/14; 716/5; 714/727; 714/30
(58) Field of Search ..................... 703/14, 15, 16; 716/4, 5; 714/30, 726, 727

(56) References Cited

U.S. PATENT DOCUMENTS

| | | | |
|---|---|---|---|
| 5,539,652 A | * | 7/1996 | Tegethoff ...................... 703/14 |
| 5,889,788 A | | 3/1999 | Pressly et al. ............... 714/726 |
| 5,949,692 A | * | 9/1999 | Beausang et al. ............. 703/15 |
| 5,991,898 A | | 11/1999 | Rajski et al. .................. 714/30 |

OTHER PUBLICATIONS

Zarrineh et al., "Automatic Insertion of Scan Structure to Enhance Testability of Embedded Memories, Cores and Chips", Proceeding of the 16th IEEE VLSI Test Symposium, pp. 98–103, Apr. 26–30, 1998.*
Bhatia et al., "Test Compaction in a Parallel Access Scan Environment", Proceedings Sixth Asian Test Symposium, pp. 300–305, Nov. 1997.*
Bhatia et al., "A Unifying Methodology for Intellectual Property and Custom Logic Testing", International Test Conference, pp. 639–648, Oct. 1996.*
Mathew et al., "DFT & ATPG: Together Again", Proceedings International Test Conference, pp. 262–271, Oct. 1995.*
Tungate et al., "Design Autoamtion Tools for Built-in Self-test Implementations", Conference Record AutoTestCon '96, Test Technology and Commercialization, pp. 113–119, Sep. 1996.*
Zhu et al., "The Algorithms of Inserting Boundary-Scan Circuit Automatically", Proceedings 5th International Conference on Solid-State and INtegrated Circuit Technology, pp. 527–531, Oct. 1998.*

(List continued on next page.)

*Primary Examiner*—Russell Frejd
(74) *Attorney, Agent, or Firm*—Klarquist Sparkman, LLP

(57) ABSTRACT

A computer-implemented method and apparatus for creating a testable circuit design that includes one or more embedded cores. The method includes identifying an embedded core within the circuit design; associating certain pins of the embedded core with pins of the circuit design; and inserting into the circuit design access circuitry coupling the certain connection pins of the embedded core to the associated pins of the circuit design. The method further includes providing test vectors for the embedded core; and generating test vectors for the circuit design by mapping the core test vectors applicable to the certain pins of the embedded core to the associated pins of the circuit design. The cores within the circuit design can then be tested after manufacture by applying the design test vectors to the circuit design.

18 Claims, 15 Drawing Sheets

OTHER PUBLICATIONS

Zorian et al., "Testing Embedded–Core Based System Chips," *Proceedings of the International Test Conference*, pp. 130–143 (Oct. 1998).

Zorian, "System–Chip Test Strategies," *Proceedings of the Design Automation Conference*, pp. 752–757, (Jun. 1998).

Bhatia et al., "A Unifying Methodology for Intellectual Property and Custom Logic Testing," *Proceedings of the International Test Conference*, pp. 639–648 (Oct. 1996).

Touba et al., "Testing Embedded Cores Using Partial Isolation Rings," *15th IEEE VLSI Test Symposium*, pp. 10–16 (May 1997).

Dias et al., "Hardware/Software Specification, Design and Test Using a System Level Approach," *Proceedings of the XII Symposium on Integrated Circuits and Systems Design*, pp. 42–45 (Oct. 1999).

* cited by examiner

PIN ASSOCIATION FOR INSERTION OF PARALLEL ACCESS CIRCUITRY

(CORE PIN CONNECTED TO A SINGLE-SOURCE NET)

METHOD AND APPARATUS FOR CREATING TESTABLE CIRCUIT DESIGNS HAVING EMBEDDED CORES

FIELD OF THE INVENTION

This invention relates generally EDA (electronic design automation) tools that execute on a computer for designing and testing electronic devices. More particularly, this invention relates to a class of EDA tools know as DFT (design-for-test). DFT tools are used to enhance the testability of products manufactured from designs by adding test hardware such a logic gates and registers to the design. At the time of manufacture, test patterns are then applied to each enhanced product to detect possible faults, or defects, in the product that may have occurred during manufacture.

BACKGROUND OF THE INVENTION

Through continual manufacturing advances, integrated circuits (ICs) are being produced today that combine features that previously required separate ICs. These complex ICs are referred to in the industry as a "systems-on-a-chip" (SOCs) because they contain as much hardware as was contained in a system of interconnected ICs several years ago.

In traditional IC design, most circuits are designed from scratch. Standard, reusable parts of the circuit are limited to basic logic gates that may be selected from standard-cell libraries. In a SOC design, by contrast, the IC is often made up of large, predefined and pre-verified building blocks and few IC-specific parts. These reusable building blocks are known in the industry as "cores" or "intellectual property" that typically consist of a pre-designed and pre-verified silicon circuit block. The cores are provided by suppliers in the form of software (such as a source code file written in a hardware description language) to the SOC designer, who embeds them into a larger design using an EDA tool. Examples of cores includes date processors, adders, and media access controllers.

Making easily testable integrated circuits is an important part of the IC design process. EDA test tools exist for creating test patterns that test for possible faults within an IC manufactured according to a design. Even with such tools, however, creating such test patterns takes significant effort because of the large number of gates within many ICs. With SOC designs having a multiple of embedded cores, the effort is even greater because of the greater complexity of the IC.

Suppliers of cores often provide test patterns that are specific for their cores. These test patterns are useful where the core is fabricated in a simple IC because they can be readily applied to and observed from the core through the input-output (I/O) pins of the IC. The test patterns, however, are not as useful where the core is embedded within a SOC design and cannot be reached by simple application of the test patterns to pins of the SOC. In such circumstances, much work must often be done to generate new test patterns that take into account the interconnections of the core to the other hardware within the SOC.

An objective of the invention, therefore, is to provide a means and method for creating a testable circuit design that includes one or more embedded cores. Another objective is to provide a means and method for using pre-existing core test patterns for testing the cores embedded within a larger circuit design.

SUMMARY OF THE INVENTION

In accordance with the invention, a computer-implemented method for creating a testable circuit design that includes one or more embedded cores is shown and described. The method comprises identifying an embedded core within the circuit design; associating certain pins of the embedded core with pins of the circuit design; and inserting into the circuit design access circuitry coupling the certain connection pins of the embedded core to the associated pins of the circuit design.

The method may further include providing test vectors for the embedded core; and generating test vectors for the circuit design by mapping the core test vectors applicable to the certain pins of the embedded core to the associated pins of the circuit design.

These and other, more specific aspects of the invention are described and shown in a following illustrative embodiment.

DETAILED DESCRIPTION OF AN ILLUSTRATIVE EMBODIMENT

The Operating Environment

The illustrative embodiment of the invention is an EDA tool in the form of a computer program that is stored on a computer-readable medium and executed on a computer system. The computer system can be of any type capable of executing such computer programs and including computer-readable media for storing computer programs. The EDA tool is described below in terms of the acts it performs. Background information on such tools is provided in a number of works including M. Abramovici et al., *Digital Systems Testing and Testable Design*. Computer Science Press, 1990; by V. D. Agarwal et al., Test Generation for VLSI Chips. Computer Science Press, 1988; and J. Rajski et al., *Arithmetic Built-In-Self-Test for Embedded Systems*. Prentice-Hall, 1998.

Overview of the Design Flow

Figure 1:
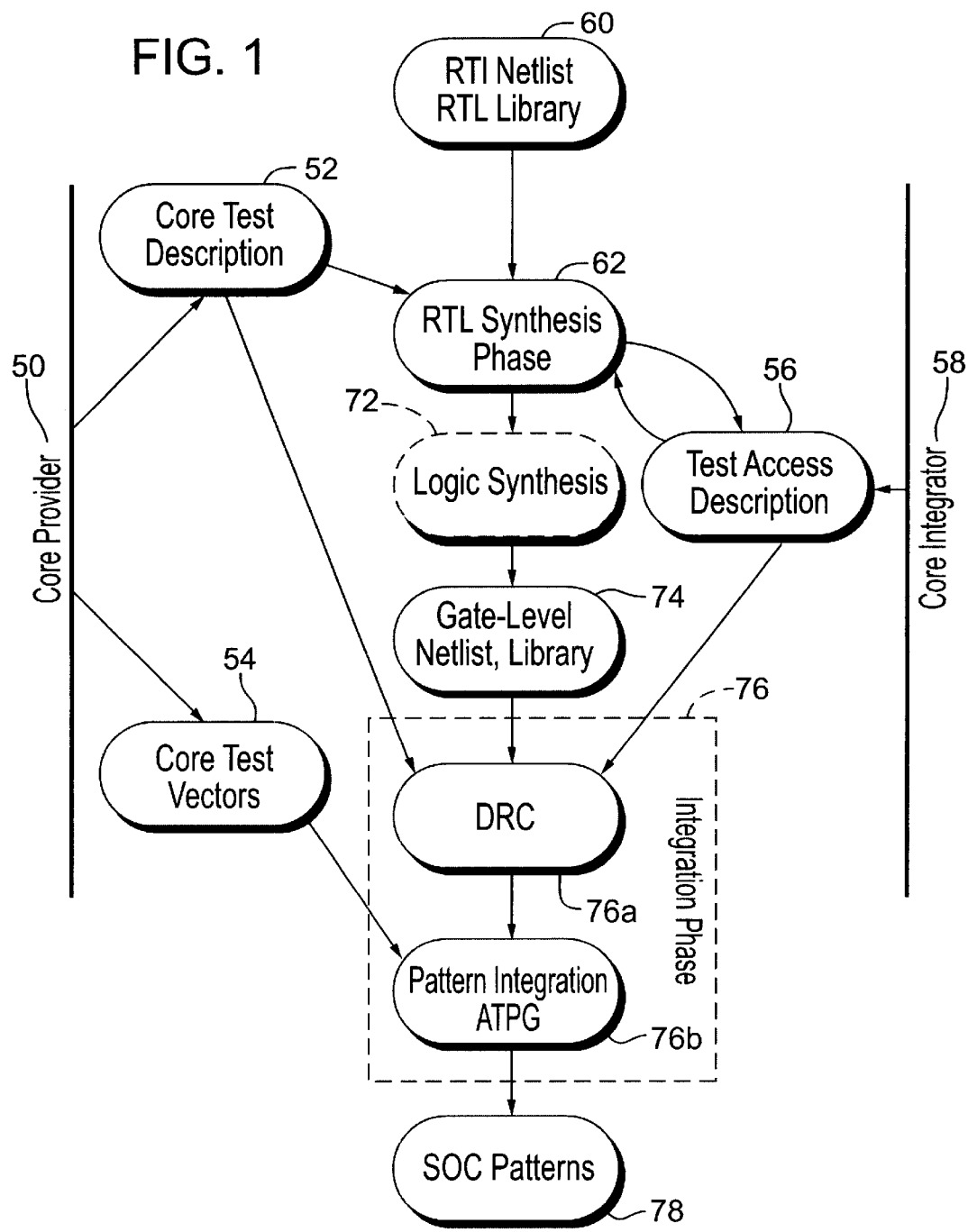
FIG. 1 is a process flow diagram showing how an integrated circuit is designed in accordance with the invention.

FIG. 1 is a design flow diagram showing how an integrated circuit such as a SOC is designed in accordance with the invention. There are thee distinct flows shown in FIG. 1: the entire flow, a synthesis phase, an 5 integration phase, and the combination of the two as part of an entire flow. The synthesis phase inserts access circuitry into an integrated circuit design, and the integration phase transforms core test vectors into design test vectors. The synthesis phase and integration phase can be used separately or together.

At the left of FIG. 1 is shown a core provider 50 such as an outside supplier that typically supplies a core description file 52 and core test vector file 54. The file 52 may contain a core declaration, timeplate definition statement, core isolation procedure, and core test procedure. The core declaration names the core and describes the core input, output, and bidirectional pins as well as specifies certain pin types such as clock, enable, etc. (The term "pin" is used herein broadly to mean any type of suitable connection). The core declaration also provides information for mapping core pins to scan cells (which is used to insert serial access circuitry) and for specifying whether a serial or parallel access method is used for all or a share of the core pins. An example core declaration is shown-in Table 1.

TABLE 1

```
core arm1 =
    input a, b, c, e, si, sen, clk;
    output x, y, so;
    inout v, w;
    enable e;
    clock clk;
    scan_in si;
    scan_out so;
    equiv a, !b;
    group e, v, w;
    default_access method parallel
    access_method parallel = clk, si. So;
    access_method serial_hold = e
end;
```

The core isolation procedure specifies a protocol for isolating the core and putting it a safe state when the core is not being tested. The core test procedure specifies a mechanism by which a core may be configured for test or put in the test mode.

The core test vector file 54 contains vectors (also known as patterns) that are applied directly to the core pins for testing the core. In the integration phase, test vectors for the circuit design are generated by mapping such core test vectors from certain pins of the embedded core to associated pins of the SOC design.

The core supplier 50 may also provide a core test access description file 56. This file describes a mechanism whereby stimulus can be delivered to the core input or bidirectional pins and the core outputs via the SOC pins. Most if not all of file 56, however, is typically generated in associating the core pins with SOC pins in accordance with the invention.

A core integrator 58 such as a SOC designer interacts with the process flow of FIG. 1 by providing a circuit design that includes one or more embedded cores. "Core" here includes not only cores obtained from other sources but user-defined logic (UDL) added by the designer around the cores. This SOC design is embodied in some form such as a RTL netlist 60 describing the elements of the circuit and their interconnections. The netlist may be represented as a list or in other equivalent forms such as a schematic drawing of the circuit in computer-readable form.

The process for creating a testable circuit design in accordance with the invention begins by entering a setup mode wherein the SOC designer 58 selects the netlist 60 and core description files 52 for each of the types of cores to be embedded in the SOC design. The test access description file 56 may also be selected if it exists. In this circumstance the test access description file is used by the integrator for explicit, manual mapping of core pins to SOC pins. Otherwise, the file 56 is generated in the process of mapping core pins to SOC pins.

Figure 2:
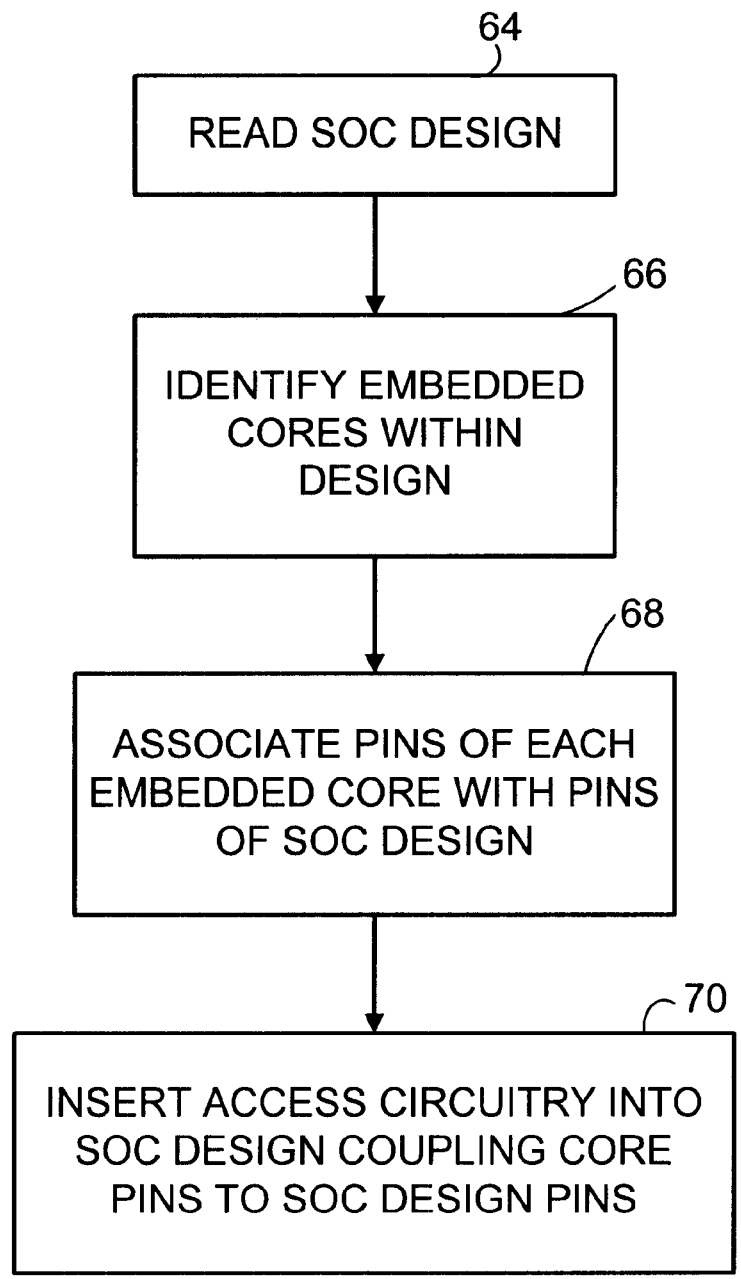
FIG. 2 is a flowchart of a method according to the invention for creating a testable circuit design that includes one or more embedded cores.

The testable circuit design is created during a synthesis phase 62. FIG. 2 is a flowchart that summarizes the acts taken during the synthesis phase to create the testable circuit design within the SOC. One of ordinary skill in the art can write source code from this flowchart in any suitable computer language such as C or C ++. First the SOC design is read from a file that contains the netlist 60 (64). The embedded cores within the design are identified with the aid of the core test description file 52 (66). Certain pins of each identified core such as input-output (I/O) pins are then associated with pins of the SOC design 68). Finally, access circuitry is inserted into the SOC design coupling the core pins to the SOC design pins (70). These acts cover both synthesis of serial access structures and parallel access structures, as will be described. The pin association is saved to the core test access file 56 and the synthesized design is saved to a separate file. p The synthesis phase concludes by performing logic synthesis on the saved design using one of a number of commercial logic synthesis tools (FIG. 1, act 72). Such a tool generates a gate-level netlist 74 that can be used, along with the test access description file 56, as input to the integration phase of the design flow.

The integration phase 76 translates precomputed core test vectors into vectors that can be applied to the SOC design. The integration phase in the illustrative embodiment operates at the gate-level, though operation at other levels is possible. The integration phase 76 has two parts: design rule checking 76a (DRC) and test pattern integration 76b.

DRC 76a ensures that the design will be valid. This includes checking design input files; checking core access, isolation, and test procedures; and checking serial access functionality. The input files such as the test access file and test procedure files are checked for syntax/usage and conflicting pin assignments. For access and isolation procedures, DRC verifies that paths exist from core pins to SOC pins. DRC also checks that cores not participating in a test are put in an isolation mode. DRC further checks the functionality of serial access circuitry that may have been added to the SOC design. The conditions necessary to establish the logical access path required to gain access to core I/O pins are computed and stored during DRC as a by-product of verifying the access circuitry. The DRC handles violations in a conventional manner, providing warnings or taking other actions as appropriate.

As described above, each type of embedded core in the SOC design has associated with it precomputed test vectors (or patterns) contained in a core test vector file 54. The processing of mapping these core test vectors (in terms of embedded core I/O pins) to SOC I/O pins is referred to herein as vector translation. Information from the DRC 76a is used by pattern integration 76b to find each access path between associated core and SOC design pins. With this information, the pattern integration 76b maps a particular core stimulus to a SOC stimulus, thereby performing the vector translation. The result of this vector translation is an output file of SOC patterns 78 that, when applied to the pins of the SOC design, tests the embedded cores.

The Synthesis Phase The synthesis phase is a process for associating core pins with SOC pins and then inserting access circuitry to establish the association.

The access circuitry to be inserted may be classified as parallel, or direct access, circuitry (because it allows access to a number of core I/O pins in parallel) or serial circuitry (because it allows access to core I/O pins serially, e.g., a scan chain). Which type of access circuitry is employed depends on which test access synthesis method is used. For parallel access synthesis, each pin of interest of a core is associated with a single pin of the SOC design, and parallel access circuitry in the form of multiplexers and tri-state equivalents is used. For serial access synthesis, multiple are associated with a single SOC pin, and serial access circuitry in the form of scan cells is used.

During testing of embedded cores, cores not under test are put into an isolation mode. To provide for this isolation and test, a decoder is inserted into the access circuitry, as discussed below with respect to FIG. 19. The decoder is responsive to address signals that address each core individually during the application of test vectors to the SOC design.

Parallel Access Synthesis

Figure 3:
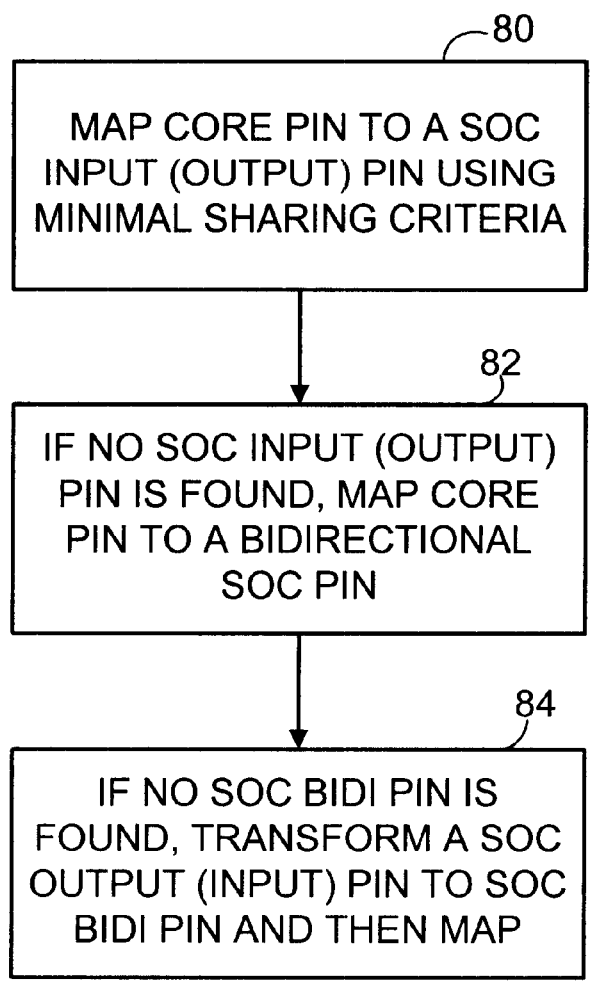
FIG. 3 is a first flowchart of a mapping method in accordance with the invention for associating core I/O pins with SOC I/O pins using parallel access circuitry.
Figure 4:
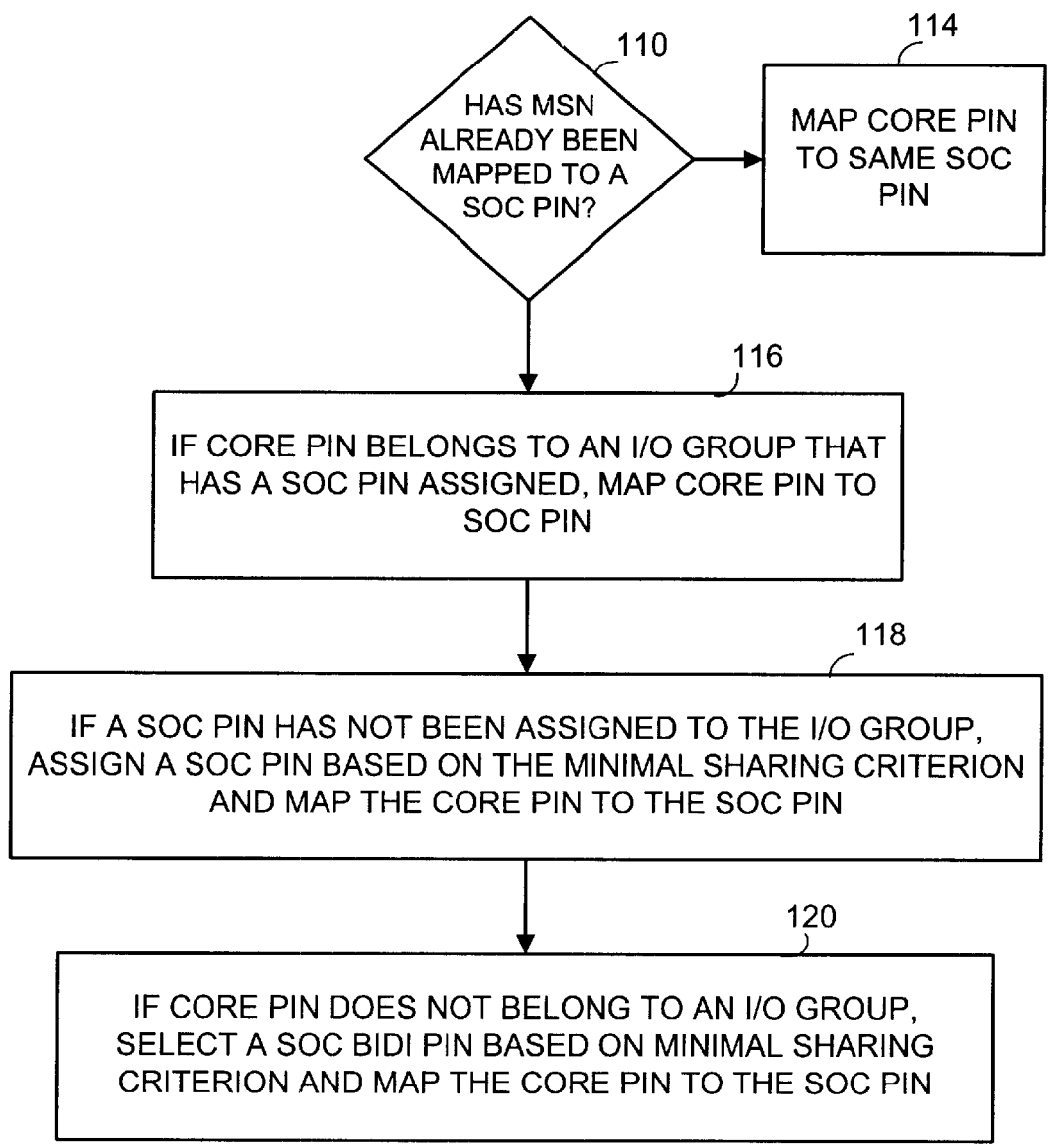
FIG. 4 is a second flowchart of a mapping method in accordance with the invention for associating core I/O pins with SOC I/O pins using parallel access circuitry.

FIGS. 3 and 4 are flowcharts of mapping algorithms employed in parallel access synthesis for associating core I/O pins with SOC I/O pins in parallel. FIGS. 5–13 show the parallel access circuitry inserted as a result of these algorithm for commonly-encountered SOC designs.

The signal paths, or nets, being driven by or driving core I/O pins are classified as single-source nets or multi-source nets. Single-source nets are driven by a single source. Such nets usually belong to two-state logic, which may be accessed by inserting two-state multiplexers (muxes) within original signal paths of the SOC design. Multi-source nets are nets driven by multiple sources. Such sources include tri-state logic and wired-AND or wired-OR logic. Output-only tri-stateable pins of a core are treated as bidirectional pins. An I/O pin classified as bidirectional is assumed to drive a multi-source net. Logic cannot be inserted on a bus between the tri-state logic and the multi-source net since this would break the system operation. Instead, a MUX-line structure (comprised of tri-state elements) feeds into the bus and senses signal values from it (since the bus can be a source or sink of signals).

Appropriate insertion circuitry is chosen based on whether an I/O pin sources or sinks a single-source or multi-source net. A core I/O pin that can serve as both a source and a sink is a bidirectional pin. Certain bidirectional core I/O pins may share the same output enable signal and thus change direction simultaneously. These I/O pins are call an I/O group. A core pin is an input pin if it is always a sink for a net and is an output pin if it is always a source for a net.

Core I/O Pins Connected to Single Source Nets

FIG. 3 shows a mapping algorithm for SOC designs where the nets to the cores are driving or are being driven by a single source. (The mapping algorithms are not applied to core pins that are tied directly to SOC pins because no additional access to these pins is required). The same algorithm may be used for mapping input and output pins as indicated in the figure. First, each core input (output) pin of interest is mapped to (i.e., associated with) a SOC input (output) pin using a minimal sharing criterion (MSN) (act 80). In the illustrative embodiment this criteria is a SOC input (output) pin that has not previously been assigned to this core and has assigned to it the least number of cores. If no SOC input pin meets this criterion, then the core pin is mapped to a bidirectional (bidi) SOC pin (act 82). If no SOC bidi meets this criterion, then a SOC output (input) pin is transformed to a SOC bidi pin and the core pin is then mapped to the transformed pin (act 84). The pin association resulting from the mapping is kept in the core test access file 56. The mappings are reflected in changes to data structure tables that record the mappings between core pins and SOC pins.

Figure 5:
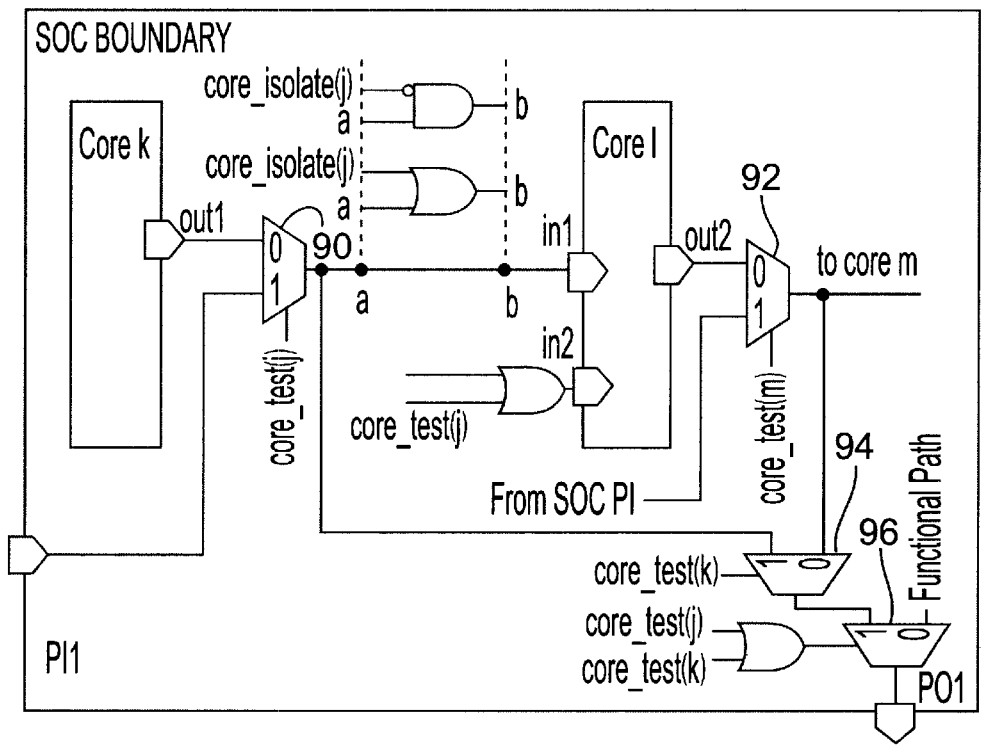
FIGS. 5–8 are schematic drawings of various SOC designs that include multiple embedded cores and access circuitry added in accordance with the method outlined in FIG. 3.

FIG. 5 shows the access circuitry (such as logic) inserted in a SOC design as a result of a mapping where there are sufficient additional SOC input and output pins for the added circuitry. The input pin in1 of core j is mapped to pin PI1 of the SOC design, and multiplexer 90 is inserted to establish the mapping. When the signal core_test(j) from the decoder (described below) is high and applied to multiplexer 90 and to input pin in 2 of core j, an input signal from PI1 is applied to in1 during a test. If in1 has to be held at a certain value when the core is in isolation (core_isolate(j) high), then additional logic needs to be inserted between points a and b such as shown in the figure. Similarly, when core_test(m) is high and applied to multiplexer 92, PI1 is applied to core m (not shown).

The output pins of cores k and j are mapped to SOC output pin PO1, and multiplexers 94 and 96 establish the mapping. When core_test(k) is high and applied to multiplexers 94 and 96, the output signal pin out2 of core k is present at SOC output pin PO1. This output signal is generated in response to a test signal applied directly from a SOC input pint to an input pin of core k (not shown). When core_test(j) is high and applied to multiplexers 90 and 96, the signal on pin out2 is present at pin PO1. This output signal is generated in response to a test signal from pin PI1 applied through multiplexer 90.

Figure 6:
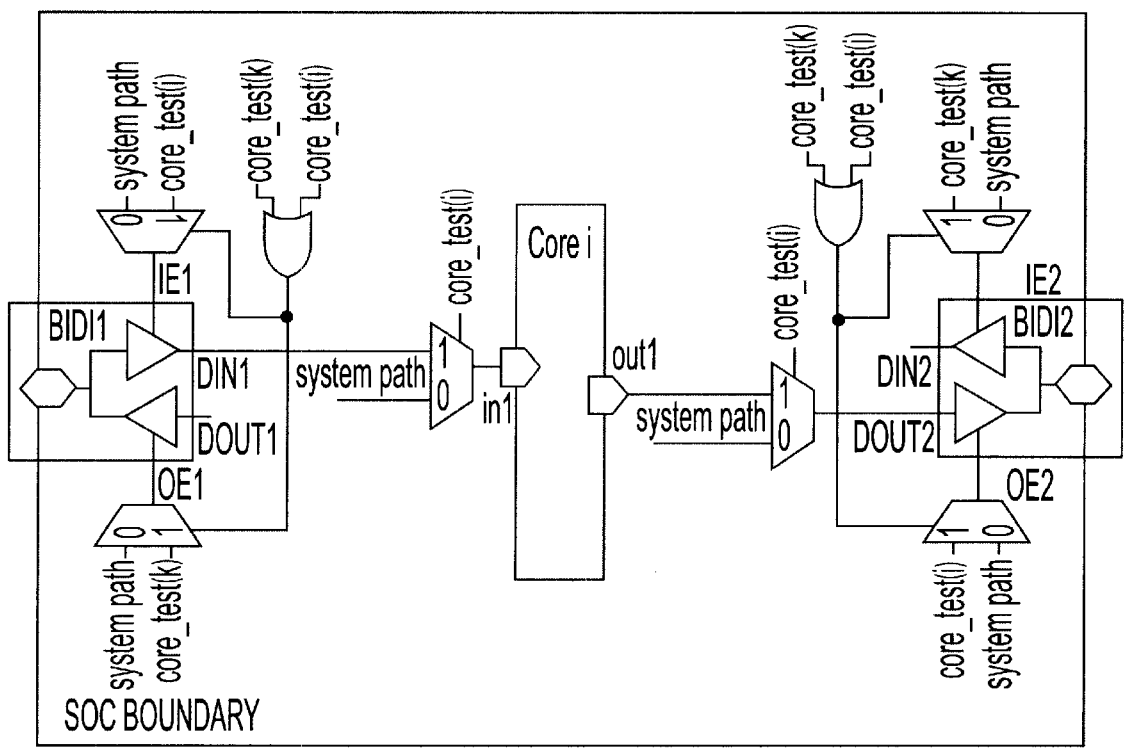

FIG. 6 shows the case where there are insufficient SOC input (output) pins, and the core pins must then be mapped to SOC bidi pins. Core i input pin in1 is mapped to SOC input pin BIDI1 because no SOC input pin is available. Additional logic 100 is then added to establish the mapping (and for mapping an output pin of core k, not shown, to pin BIDI1). The logic 100 assumes that an enable signal IE1 needs to be turned on and the output enable signal OE1 needs to be turned off to enable the input path from pin BIDI1 to pin 1in. Similarly, logic 102 is added for mapping core i output pin out1 to SOC output ping BIDI2 (and for mapping an input pin of core k, not shown, to pin BIDI 2).

In some cases, no SOC pin meeting the requirement of 80 and 82 may be available. To provide a SOC input pin in this case, a SOC output pin is transformed into a SOC bidi pin. Similarly, to provide a SOC output pin in this case, a SOC input pin is transformed into a SOC bidi pin. The transformed pin behaves as its was originally designed, i.e. a SOC input or output pin when functioning normally (functional mode). When used for testing (test mode), the transformed pin behaves as a bidirectional pin.

During the mapping act (68 of FIG. 2) a SOC I/O pin can be transformed to a bidi pad with the following operation.

If the original SOC pin is an input (output) pin, replace the pin with a corresponding equivalent bidi pin. Tie the output enable (OE) pin to logic 0 (logic 1) and the input enable (IE) pin, if applicable, to logic 1 (logic 0). In functional mode, the bidi pin thus works as an input-only (output only) pin.

Figure 7:
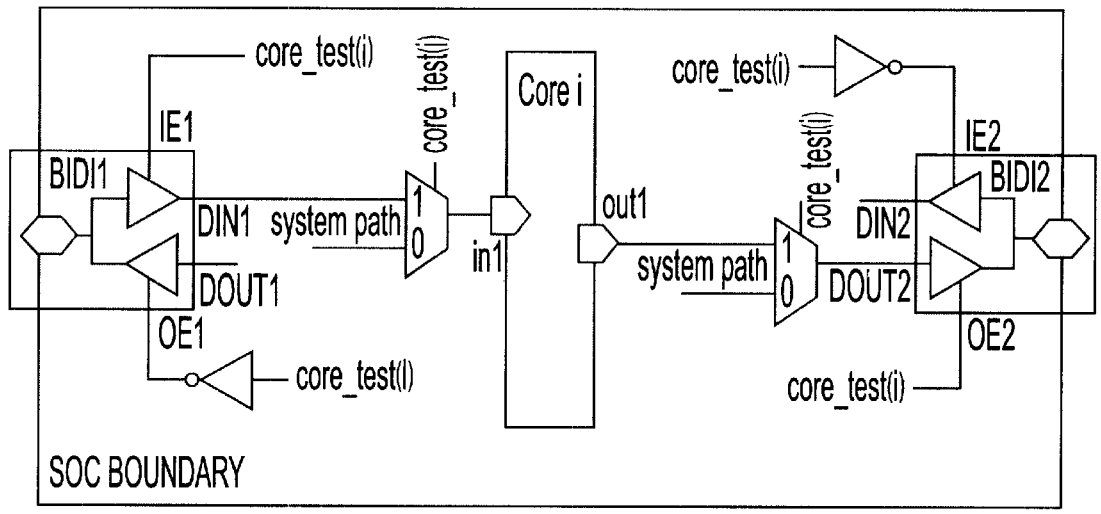

FIGS. 6 and 7 illustrate how the above transformation works. Assume in FIG. 6 that pin BIDI1 was originally an output pin and the pin BIDI2 was originally an input pin. Using the transformation rule as part of the mapping act, IE1 is tied to logic 0, OE1 is tied to logic 1, IE2 is tied to logic 1, and OE2 is tied to logic 0 to preserve the original functionality of the I/O pins in the functional mode. These logic values are supplied to the enable pins by the system path via muxes 100a, b and 102a, b. Thus when core i is in test mode, core_test(i) is high and pin BIDI1 is configured as an input pin and pin BIDI2 is configured as an output pin. When core i is not being tested (core_test(i) is low), pin BIDI1 is configured as an output pin and pin BIDI2 is configured as an input pin, the same configuration as in the functional mode.

Core I/O Pins Connected to Multi-Source Nets

FIG. 4 shows a mapping algorithm for SOC designs where the nets to the cores are driving or being driven by a multiple sources. The core I/O pin is first examined to see if it has already been mapped to a SOC pin (110). If so, the core pin is again mapped to the same SOC pin (112). If not, the core pin is examined to see if it is part of an I/O group that already has a SOC pin assigned to (114). If it is, the core pin is mapped to the SOC pin. If not, the core I/O pin is mapped to a SOC I/O pin based on the minimal sharing criterion (116). If no SOC I/O pin is available, the core pin is mapped to a SOC bidi pin (118). And if no SOC bidi pin is available, then a SOC input (output) pin is first transformed to a bidi pin and then the core pin is mapped to the transformed pin (120).

Test access logic is inserted in accordance with the algorithm of FIG. 4, at one insertion per multi-source net. Two general cases need to be considered.

In case a SOC bidi pin is available to map to a core I/O pin, an additional SOC input pin may be required to serve as a direction control pin. In this case, a core I/O pin is mapped to two SOC I/O pins. All core I/O pins which feed the same multi-source (or tri-state) net may use the same structure for test access. Three specific cases need to be considered when configuring logic to access core bidi pins via SOC bidi pins.

Figure 8:
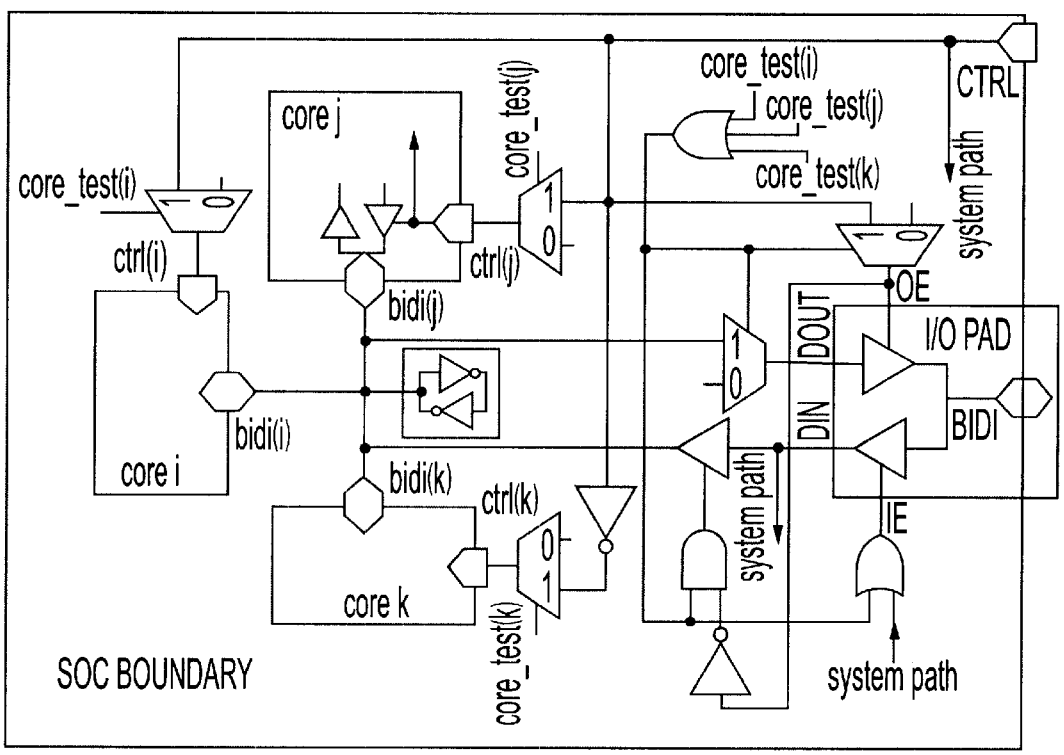
Figure 9:
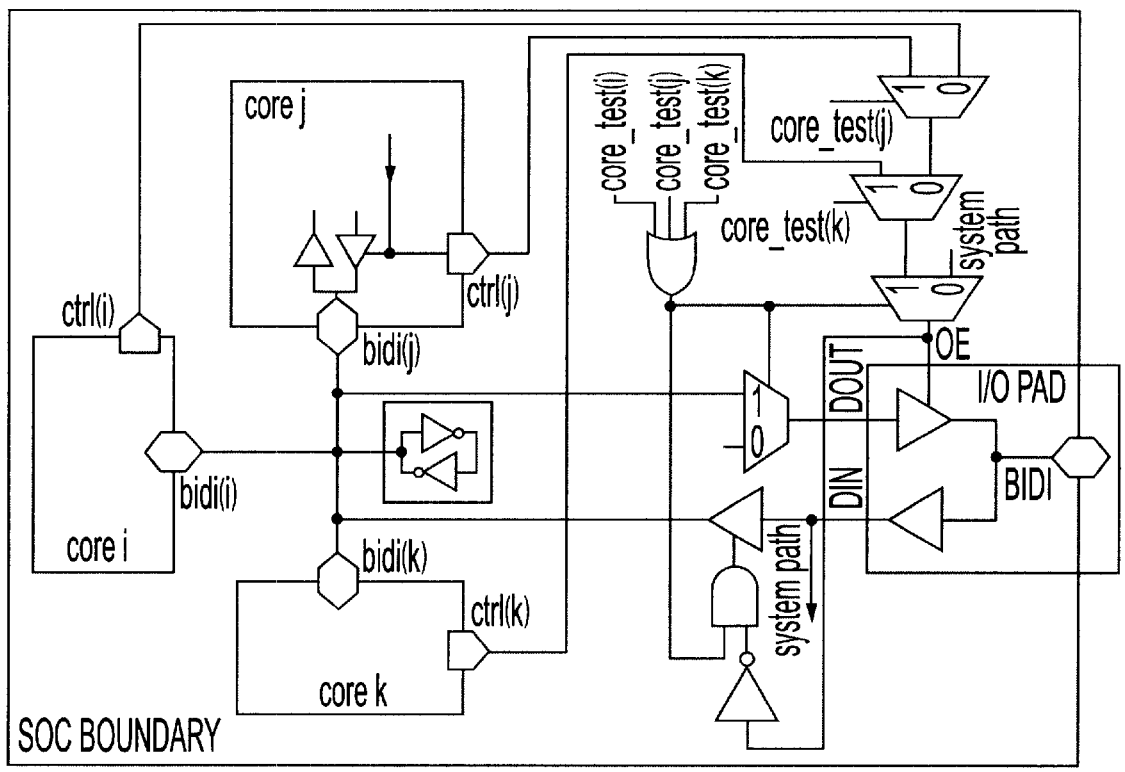
FIGS. 9–13 are schematic drawings of various SOC designs that include one or more embedded cores and access circuitry added in accordance with the method outlined in FIG. 4.

In a first specific case, direction control for a core bidi pin is accessible via a core primary input pin. FIG. 9 shows the test logic inserted to allow access to core I/O bidi(i), bidi(j), and bidi(k) pins via a SOC bidi pin when each core bidi pins directly controllable from the core boundary. Each bidi pin is associated with a direction control input pin ctrl(i), ctrl(j), and ctrl(k), respectively. It should be noted that the access circuitry is not inserted in by breaking the multi—source net—the access circuitry just becomes another driver for the multi-source net. FIG. 8 also shows the insertion of an optional keeper to prevent the net from floating in case all the drivers are turned off during test mode.

The knowledge of an externally accessible direction control input pin allows one to use the same SOC pin (CTRL) to control the direction of the core bidi pins as well as the enables for the tri-state drivers that drive the multi-source net from the SOC boundary. During test pattern translation, no special processing is necessary to set up the value for the SOC CTRL pin since the information is already embedded in the core patterns (as values for pins ctrl(i), ctrl(j), or ctrl(k)) and the translation process automatically maps such values to the appropriate value for CTRL.

In a second specific case, direction control for a core bidi pin is not externally controllable, but the internal direction control signal is observable via a core output pin. FIG. 9 shows the case where a core may have bidi pins which are internally controlled, but the internal control signal is observable through a core output pin. This signal may then be used to control the tri-state drivers used for access. In this case the test pattern translation mechanism does not need to explicitly compute the values for the enables for the tri-state drivers used to access the cores since the enable values are provided automatically by the core under test.

Figure 10:
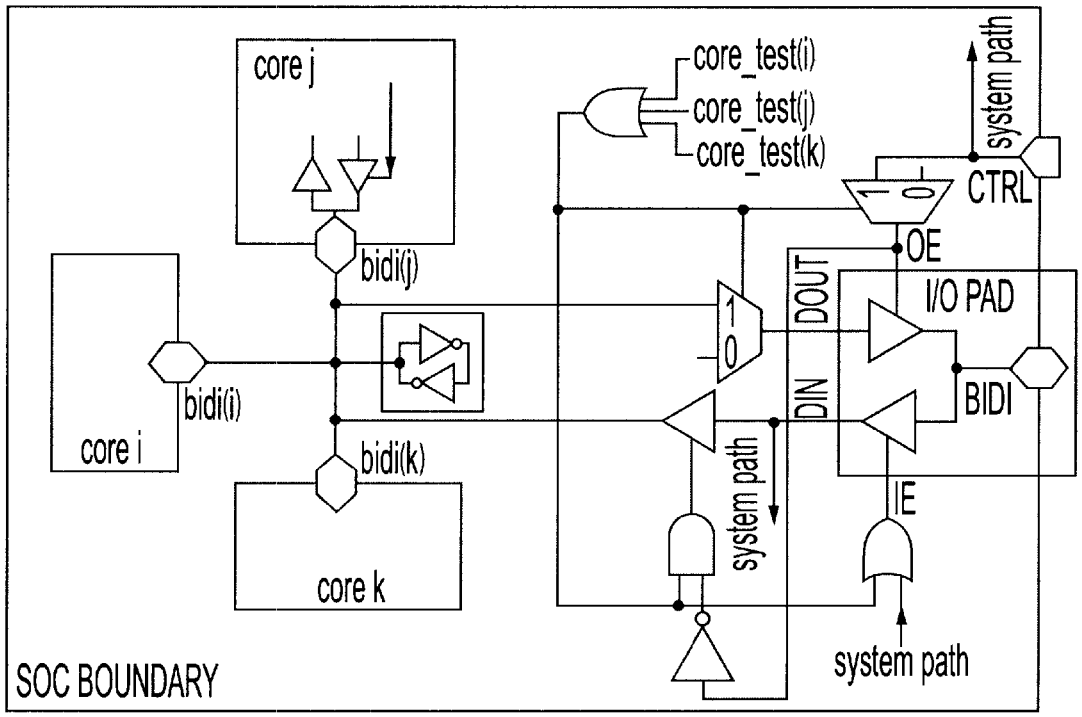

FIG. 10 shows a third specific case where direction control for a core bidi pins is neither controllable or observable for core I/O pins. The value for the pin CTRL is inferred from the test patterns for each of the cores, assuming that the vector format supports the use of special characters for inferring whether the core bidi pin is in input mode or output mode.

Figure 11:
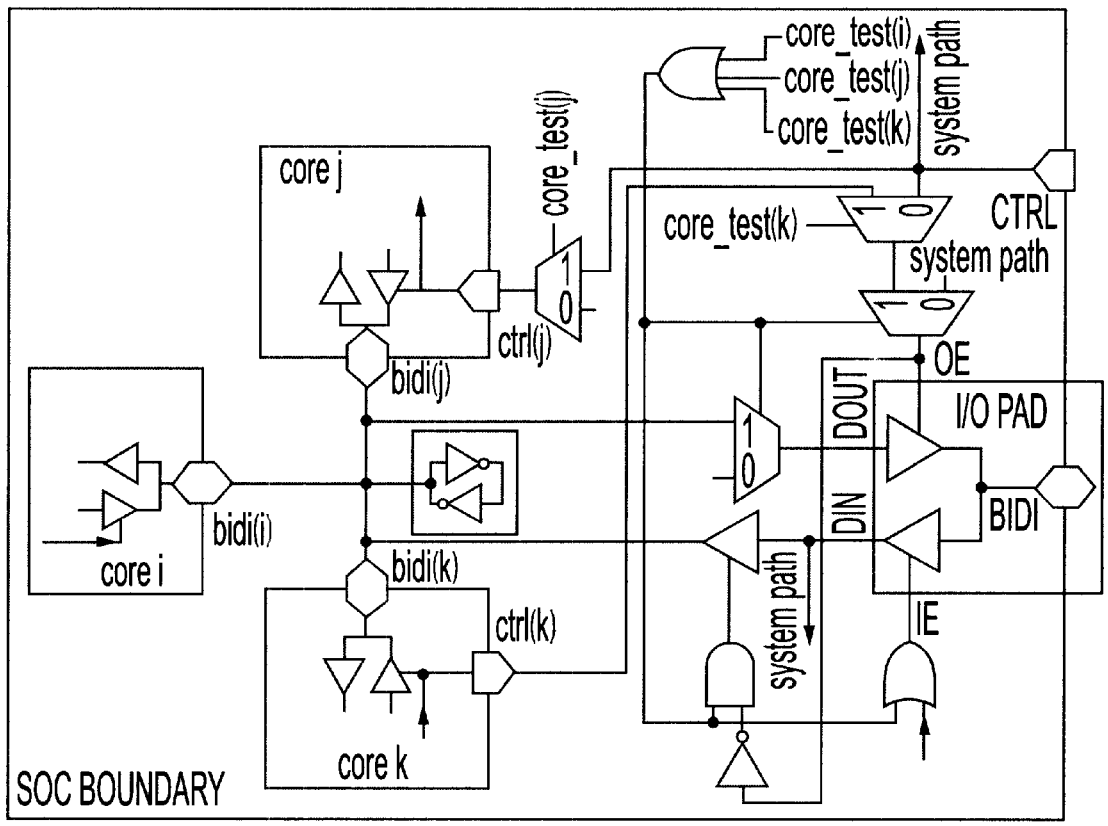

FIG. 11 shows a hybrid design where different cores have different control mechanisms. For core i, the enable pin for the bidi is neither controllable or observable. Core j has an externally controllable bidi enable pin and core k has an externally observable bidi enable pin.

Figure 12:
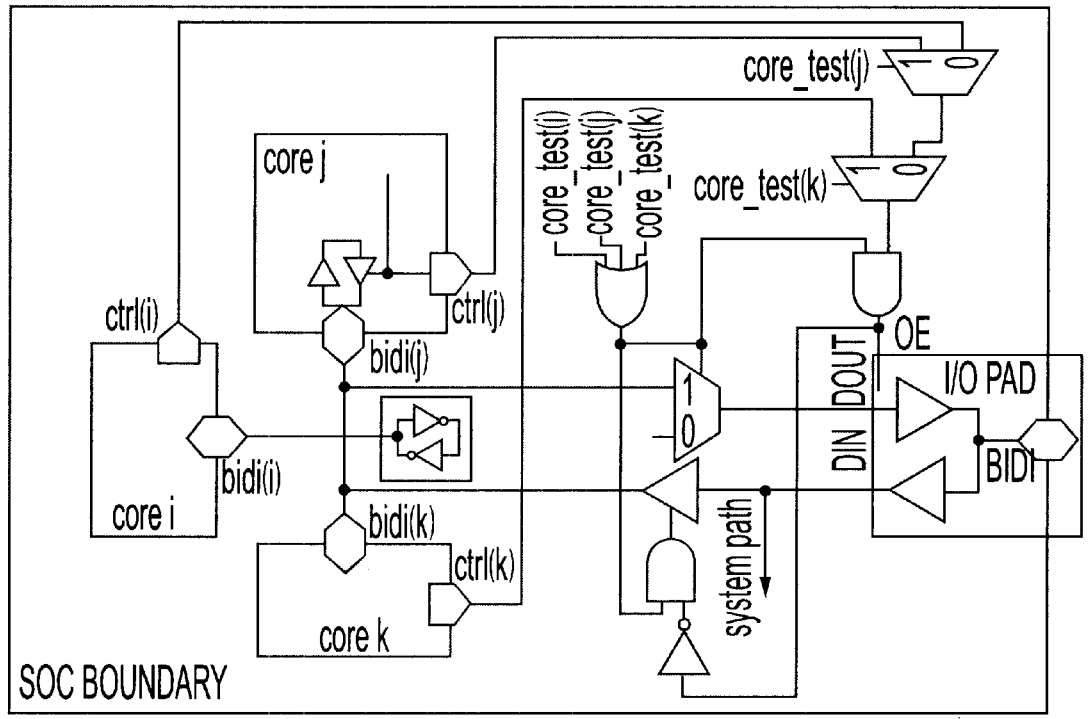

FIG. 12 shows application of the I/O pad transformation rule to the access structure shown in FIG. 9. Here it is assumed that the SOC bidi was a SOC input-only pin that was transformed to a bidi pin by tying pin OE of the bidi pad to logic 0 before inserting the test access structure.

Figure 13:
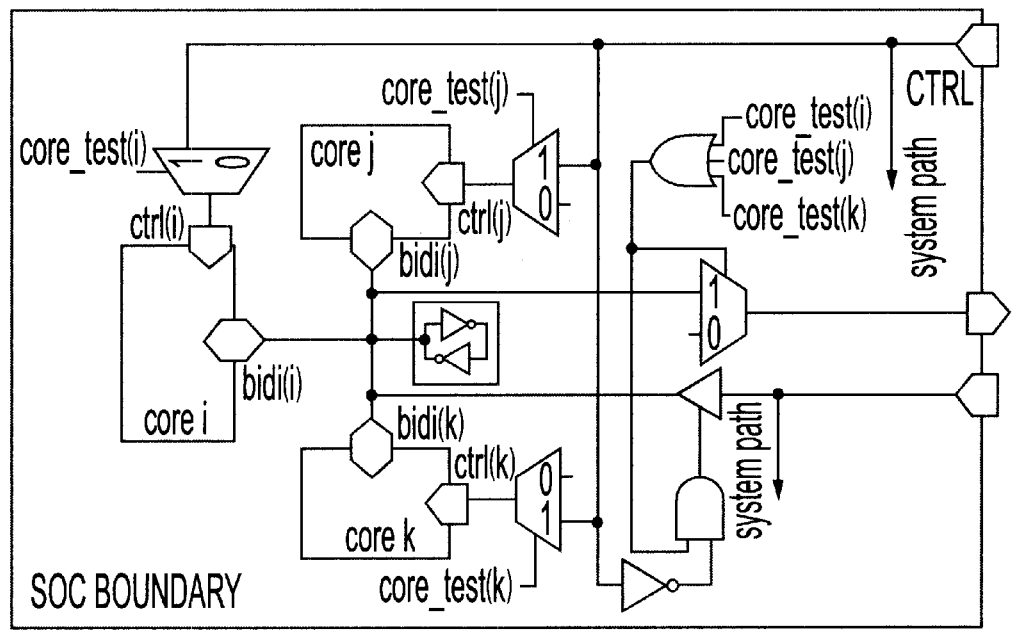

If a SOC bidi pin is not available (either originally or through transformation) to map to a core I/O pin, the core pin is mapped to a SOC output pin and two SOC input pins as shown in FIG. 13.

If a user indicates that certain core pins share the same direction control or output enable pin, the test output enable pin is shared. Each group of pins in an I/O group will have one SOC pin assigned as a direction control pin. The core test description file for the core allows a user to specify grouping information.

Serial Access Synthesis

With serial access circuitry, core test vectors which originally required application of a set of stimuli at a particular point in time are now applied by shifting the required stimuli through a scan chain. Similarly, core outputs are observed by capturing the outputs in a scan chain and then shifting of the chain's contents.

Figure 14:
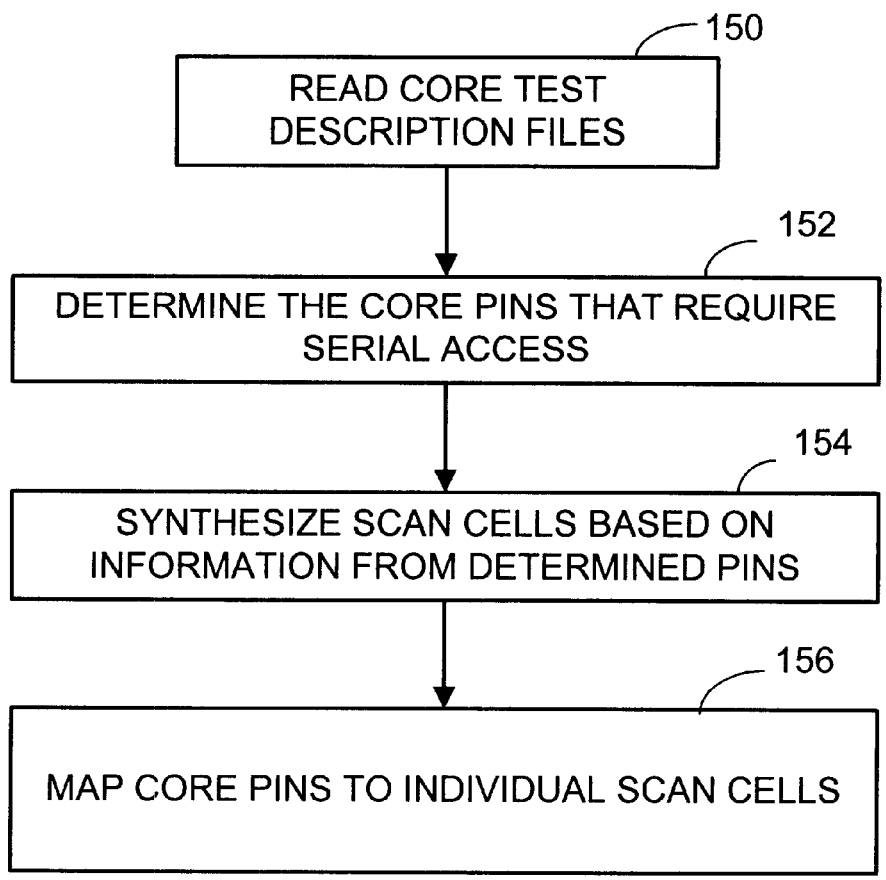
FIG. 14 is a flowchart of a mapping method in accordance with the invention for associating core I/O pins with serial access circuitry.

FIG. 14 shows generally the acts for associating core pins with SOC pins where the test access circuitry is serial in nature. Core test description files are read (150). These files contain the definitions of the cores and the access mechanisms for accessing the core (serial versus parallel). The core pins that require serial access are then determined (152). These determinations are made based on the information provided in the CTDL files, and a list is provided. Scan cells for the determined pins are then synthesized (154) and the core pins are mapped to the individual scan cells (156). This creates at one-to-one correspondence between cores I/O pins and the created scan cells. Scan-ins, scan-outs, scan-enables, and scan-clocks are mapped to SOC I/O pins use multiplexers.

Figure 15A:
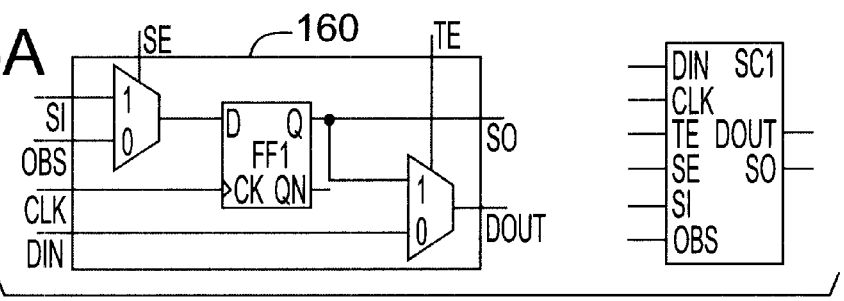
FIGS. 15A–18 are schematic drawings of various SOC designs that include one or more embedded cores and access circuitry added in accordance with the method outlined in FIG. 14.
Figure 15B:
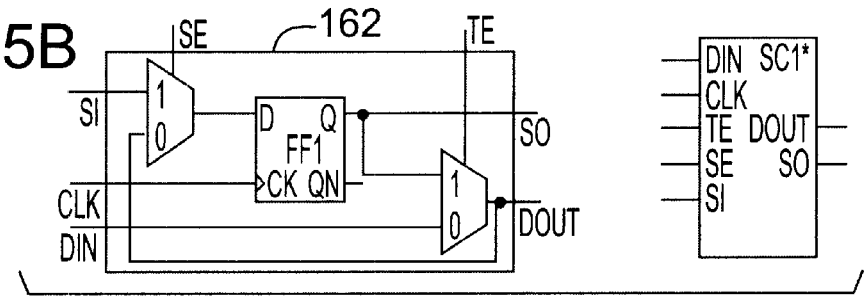
Figure 15C:
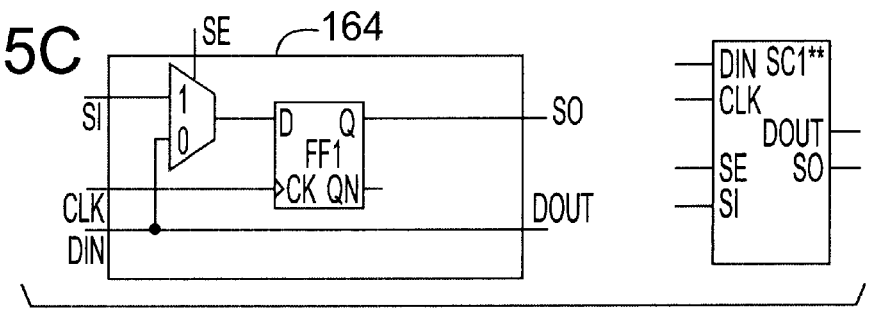
Figure 16:
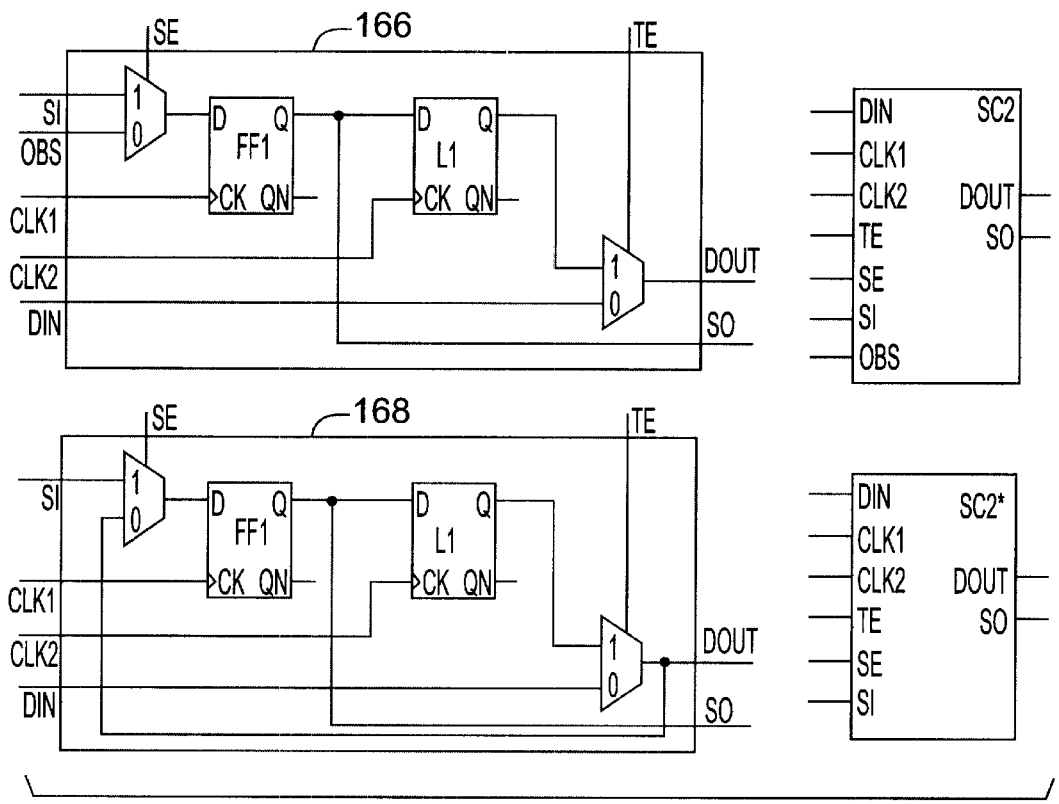

FIG. 15A shows a scan cell 160 (and its symbol) for unidirectional I/Os, which provides a direct path during the normal functional mode of a core and an indirect path through a shift register cell during the test mode. When the input TE (test enable) is logic 0, the input DIN is directly fed to output DOUT. The scan output from the previous scan cell is fed into input Si (scan in) and the input SE (scan enable) enables scan shifting when at logic 1. When TE is at logic 1, the output of the scan flip-flop FF1 is connected to DOUT. The pin SO functions as a scan output for the cell and is fed to the scan input of the next scan cell in the scan chain. This structure can thus be used to capture the response from an observation point OBS and also to apply an arbitrary input pattern via DOUT. CLK is used both as a capture clock (to capture data from OBS when SE is O) and also as a shift clock (SE is 1). FIGS. 15B and 15C show two other versions 162 and 164 of the scan cell. In scan cell 162 DOUT is internally routed to the capture input (OBS). Scan cell 164 is designed only to observe the logic under test. To protect downstream logic from the ill-effects of scan shifting, the scan cells 166 and 168 shown in FIG. 16 can be used.

Figure 17:
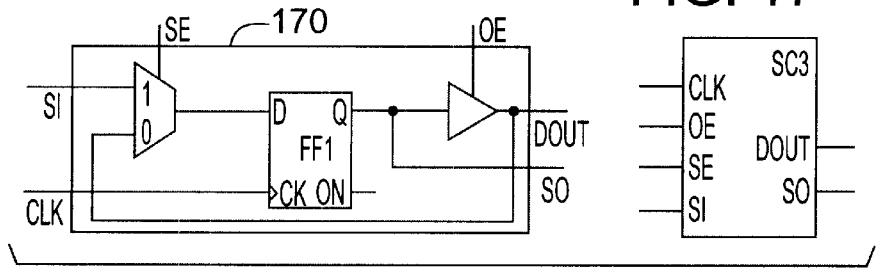
Figure 18:
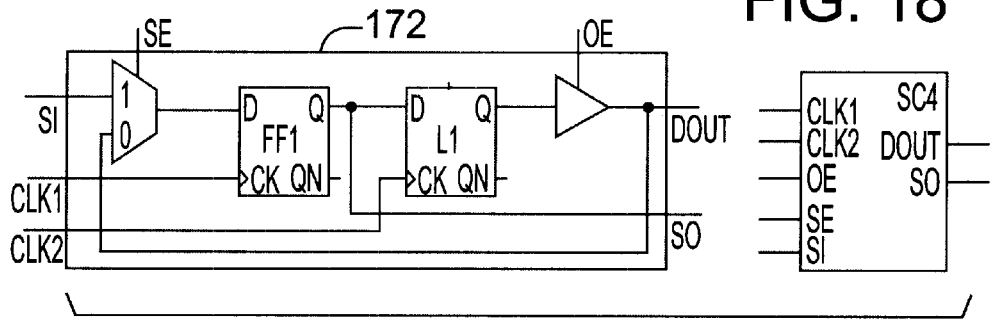

Scan cells for bidirectional core I/O pins have a tri-state driver feeding DOUT instead of the two-state multiplexers. FIG. 17 shows a scan cell 170 where an output enable signal (OE) is used to enable the tri-state driver. The value applied to OE should be the inverse of the direction of the core bidi pin being controlled by the scan cell. For example, it should be at logic 1 when the core bidi pin is in input mode (tri-stated) and at logic 0 when the core bidi pin is in output mode. FIG. 18 shows a scan cell 172 for bidirectional core pins which isolates downstream logic from scan shifting.

The inventive concept can also be applied to scan wrappers. A scan wrapper provides access by putting a scan wrapper around a core. All or a subset of I/Os of the core become accessible via the scan ring, and a serial interface provides a means for applying any arbitrary input patter to the core. This application can be done by shifting or "scanning in" and observing the output response of the core by capturing it in the scan ring and then "scanning out."

Testing the Cores

Figure 19:
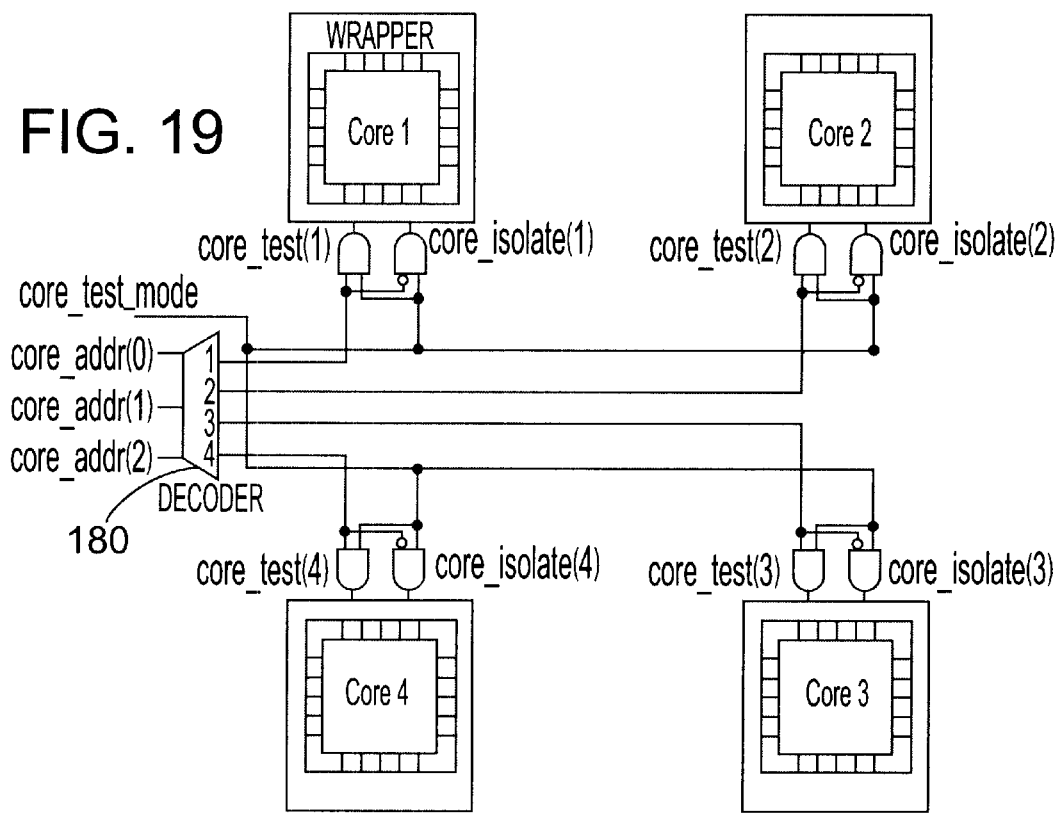
FIG. 19 is a schematic drawing illustrating the decoder that is part of the access circuitry and its interconnection to cores of a SOC design.

During the synthesis of the access circuitry, it is assumed that the embedded cores are tested sequentially and that cores not being presently tested are put into an isolation state. FIG. 19 shows a decoder 180 that is inserted into the access circuitry to provide for this isolation and test. The decoder is responsive to address signals that address each core individually during the application of test vectors to the SOC design.

The configuration signals used for parallel and serial access to the cores are the same, allowing for a hybrid access mechanism. The SOC design has a global test signal (core_test_mode) that configures the SOC design to allow for test of embedded cores. A group of primary input signals core_addr(i) (either shared with existing SOC primary inputs or extra primary inputs) are used as encoded core addresses to select each core for test. The encoded core address is decoded to create a dedicated signal called core_select(i) for each core i. For C cores, there are (C+2) core_select(i) signals.

The core_test_mode signal and core_select(i) signal are used to derive the core_test(i) and core_isolate(i) signals in accordance with the following truth table:

| core_test_mode | core_select(i) | core_test(i) | core_isolate(i) | mode |
|---|---|---|---|---|
| O | X | O | O | functional |
| 1 | O | O | 1 | isolation |
| 1 | 1 | 1 | O | test |

The core_select(i) signals are treated as don't cares when core_test_mode is inactive. The core test(i) and core isolate (i) signals when active configure a core i in test and isolation modes, respectively.

Partitioning the Test Access Circuitry

Place-and-route efficiency may be reduced if all of the test access logic generated in accordance with the invention were placed in a single logic block. Many place-and-route tools use the hierarchy of a circuit design to determine independently placeable blocks. To facilitate the placing and routing of the added circuitry and to maintain a clear boundary between the added circuitry and the original SOC design, a hierarchical partitioning policy is followed.

Figure 20:
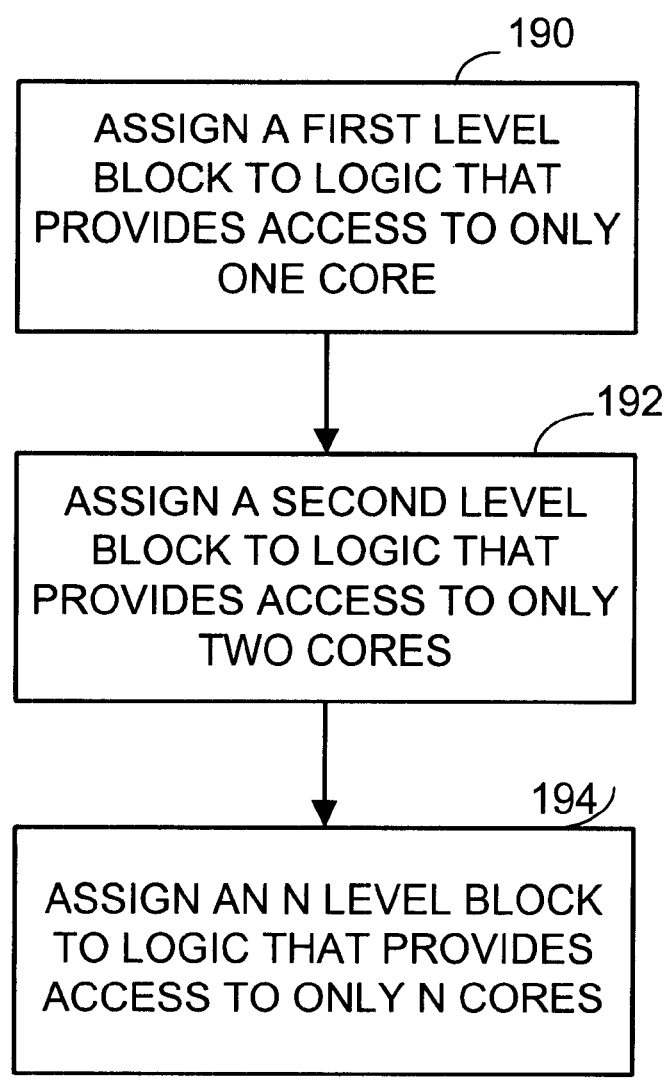
FIG. 20 is a flowchart of a method according to the invention for creating a hierarchy of access blocks within the access circuitry.

FIG. 20 is a flowchart of the partitioning algorithm. Each piece of added logic is analyzed. Logic that provides access to only one core is first considered and assigned a hierarchical block (190). Logic that is shared between two cores is then considered and placed in a separate hierarchical block (192). This second block thus includes the block formed by act 190. The above procedure is repeated for higher-order combinations (e.g., logic shared by three cores) up to a maximum number of block levels (194).

The Integration Phase

Figure 21:
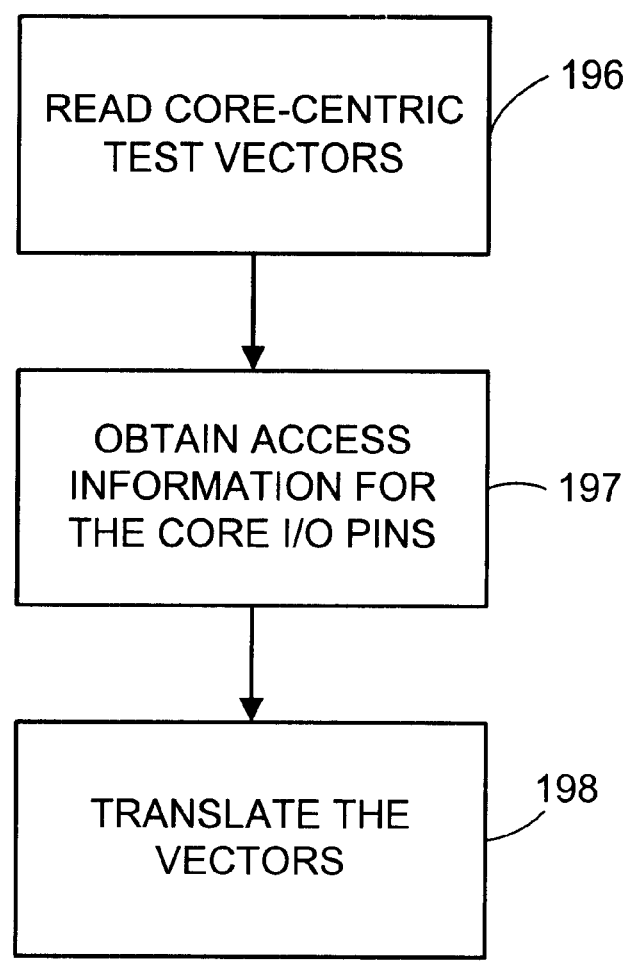
FIG. 21 is a flowchart of a method of according to the invention for translating core test vectors to circuit design test vectors.

The integration phase translates precomputed core vectors to the SOC design. In the illustrative embodiment this is accomplished by reading the core description files, core test access files, test pattern files and the synthesized (gate-level) netlist and integrating them into a SOC test pattern set. FIG. 21 illustrates this process. The core-centric test vectors are read (196). These are vectors that were precomputed for the core as a stand-alone entity. Access information for the core I/O pins is then obtained (197). If an I/O pin has direct (parallel) mapping, the access information contains the name of the SOC pin to which the core I/O pin is mapped. If the I/O pins has serial mapping, the access information contains the scan cell instance name. The core-centric test vectors are then translated (198). All pins referenced in the core vectors are verified to have an access mechanism (direct or serial). For each vector in the test vector file, the following is done. If the referenced pin has direct access, translate the core pin stimulus/response to the corresponding SOC pin. If the referenced pin has serial access, translate the core pin stimulus response to a scan operation wherein the required value is either established or observed via a scan operation.

Before the SOC test patterns are generated, design rule checking (DRC) is run (see FIG. 1). This check provides an early warning in case the SOC topology prevents the successful translation of core vectors to SOC vectors. Information from the DRC is used to set up an access path map a particular core stimulus to a SOC stimulus. The conditions necessary to establish the logical path required to gain access to core I/Os are computed and stored during DRC as a by-product of verifying the access circuitry.

Figure 22:
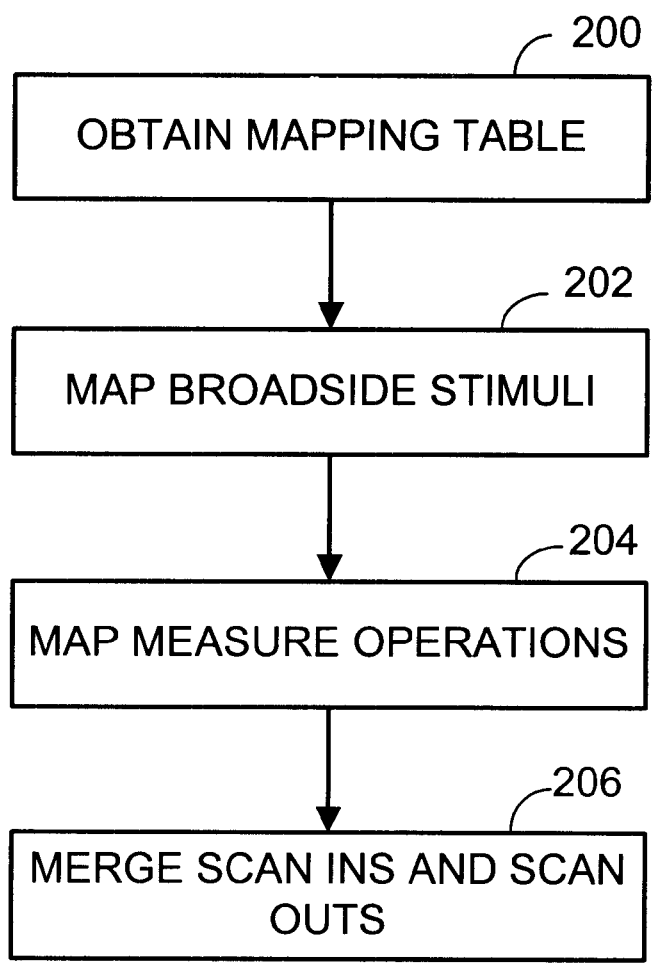
FIG. 22 is flowchart of a method of according to the invention for. translating core test vectors to circuit design test vectors where serial access circuitry is added to the circuit design.

If serial access is being used, the following additional integration acts shown in FIG. 22 are performed. The mapping table is obtained from DRC or other source (200). This mapping table maps all core I/Os that are accessed during test to either a SOC I/O or the output of a scan cell. Broadside stimuli for all core I/Os receiving input from scan cells to a scan in operation are mapped (202). All measure operations for all core I/Os feeding into scan cells to a scan out operation are mapped (204). Scan ins and scan outs of sequences are merged where possible (206).

Having illustrated and described the principles of the invention in an illustrative embodiment, it should be apparent to those skilled in the art that the embodiment can be modified in arrangement and detail without departing from such principles. Many of the software aspects of the embodiment may be implemented in hardware and many of the hardware aspects may be implemented in software. In view of the many possible embodiments to which the principles of the invention may be applied, it should be understood that the illustrative embodiment is intended to teach these principles and is not intended to be a limitation on the scope of the invention. We therefore claim as our invention all that comes within the scope and spirit of the following claims and their equivalents.

We claim:

1. A computer-implemented method for creating a testable circuit design that includes one or more embedded cores, the method comprising:
   automatically identifying an embedded core within the testable circuit design, the embedded core having pins connecting the core internally within the circuit design;
   automatically associating certain pins of the embedded core with pins of the circuit design; and
   inserting into the circuit design access circuitry coupling the certain connection pins of the embedded core to the associated pins of the circuit design.

2. The method of claim 1 wherein identifying an embedded core comprises examining a core test description file associated with the embedded core.

3. The method of claim 1 where in associating certain pins with circuit design pins includes storing in a core test access file information that describes the association.

4. The method of claim 1 wherein inserting access circuitry includes inserting a hierarchical block of access circuitry.

5. The method of claim 1 wherein the access circuitry inserted into the circuit design includes a decoder for sequentially accessing embedded cores to be tested.

6. The method of claim 1 wherein the access circuitry inserted into the circuit design comprises parallel access circuitry.

7. The method of claim 1 wherein the access circuitry inserted into the circuit design comprises serial access circuitry.

8. The method claim 1 including:
   providing test vectors for the embedded core, the test vectors applicable to the pins of the embedded core; and
   generating test vectors for the circuit design by mapping the core test vectors applicable to the certain pins of the embedded core to the associated pins of the circuit design.

9. A computer-readable medium having computer-executable instructions for performing the acts of claim 1.

10. The method of claim 1 wherein the automatically identifying and the automatically associating comprise running an executable computer program with inputs that include a netlist and a core test description file.

11. The method of claim 1 wherein the access circuitry includes a decoder that allows a specific core to be tested and other cores to be isolated and not tested.

12. A computer-implemented method for generating test vectors for a circuit design that includes one or more embedded cores, the method comprising:
   automatically identifying an association between certain pins of an embedded core and pins of the circuit design; and
   automatically generating test vectors for the circuit design by mapping core test vectors applicable to the certain pins of the embedded core to the associated pins of the circuit design.

13. The method of claim 12 wherein mapping core test vectors includes:
   if the certain pin of the embedded core has direct access to a pin of the circuit design, translate the vector stimulus/response for the certain pin to the circuit design pin; and
   if the certain pin of the embedded core has serial access to a pin of the circuit design, translate the vector stimulus/response for the certain pin to a scan operation.

14. A computer-readable medium computer-executable instructions for performing the acts of claim 12.

15. The method of claim 12 wherein identifying the association between certain pins of the embedded core and pins of the circuit design comprises examining a core test access file.

16. A computer-readable medium having a tool for creating a testable circuit design that includes one or more embedded cores, the tool comprising:
   an automatic core-identifying mechanism that identifies an embedded core within the circuit design, the embedded core having pins connecting the core internally within the circuit design;
   an automatic mapping mechanism that associates certain pins of the embedded core with pins of the circuit design; and
   a circuitry insertion mechanism that inserts into the circuit design access circuitry coupling the certain pins of the embedded core to the associated pins of the circuit design.

17. The computer-readable medium of claim 16 including:
   a core test vector file for the embedded core, the test vectors applicable to the pins of the embedded core; and
   a test vector generating mechanism that generates test vectors for the circuit design by mapping test vectors from the core test vector file applicable to the certain pins of the embedded core to the associated pins of the circuit design.

18. A computer-readable medium having a tool for generating test vectors for a circuit design that includes one or more embedded cores, the tool comprising:
   an automatic identifying mechanism that identifies an association between certain pins of an embedded core and pins of the circuit design; and
   an automatic test vector generating mechanism that generates test vectors for the circuit design by mapping core test vectors applicable to the certain pins of the embedded core to the associated pins of the circuit design.

* * * * *